United States Patent [19]
Sakabe

[11] 4,103,240
[45] Jul. 25, 1978

[54] FM TUNING INDICATOR

[75] Inventor: Nobuyuki Sakabe, Nagoya, Japan

[73] Assignee: Shin-Shirasuna Electric Corp., Nagoya, Japan

[21] Appl. No.: 821,075

[22] Filed: Aug. 2, 1977

Related U.S. Application Data

[63] Continuation of Ser. No. 661,504, Feb. 26, 1976, abandoned.

[30] Foreign Application Priority Data

Jun. 17, 1975 [JP] Japan ................................. 50-73337

[51] Int. Cl.² ............................................... H04B 1/16
[52] U.S. Cl. .................................... 325/349; 325/318; 325/398; 325/455; 307/260
[58] Field of Search ............... 328/344, 349, 398, 455, 328/318, 363, 364, 181; 329/110, 111; 307/260, 261, 268, 269, 270; 330/30 D

[56] References Cited

U.S. PATENT DOCUMENTS

| | | | |
|---|---|---|---|
| 3,333,180 | 7/1967 | Neu | 307/260 |
| 3,418,528 | 12/1968 | Watanabe | 307/260 |
| 3,696,301 | 10/1972 | Hoshi | 325/398 |
| 3,748,582 | 7/1973 | Ohsawa | 325/398 |
| 3,896,386 | 7/1975 | Ohsawa | 325/455 |

Primary Examiner—Robert L. Griffin
Assistant Examiner—Tommy P. Chin

[57] ABSTRACT

An FM tuner comprising means for producing an intermediate frequency signal, a frequency discriminator circuit having "S" characteristics, a differential amplifier circuit, and detector means. The bias of said differential amplifier circuit is controlled in accordance with the direct current component of the output of said frequency discriminator circuit, and part of said intermediate frequency signal is passed to said detector means through said differential amplifier circuit, whereby that frequency position of said intermediate frequency signal which corresponds to the center of said direct current component is detected. Thus, it is possible to determine whether or not the FM tuner is in an optimum tuned state.

5 Claims, 4 Drawing Figures

FM TUNING INDICATOR

This is a continuation of application Ser. No. 661 504, filed Feb. 26, 1976, now abandoned.

BACKGROUND OF THE INVENTION

1. Field of the Invention

This invention relates to an FM tuner, and more particularly it pertains to an FM tuner designed so that it is possible to determine whether or not the tuner is in an optimum tuned state, and a method of effect such determination.

2. Discription of the Prior Art

Conventionally, in order to determine whether or not an FM tuner is in an optimum tuned state, part of an intermediate frequency signal of say 10.7MHz was taken out to be passed to a meter through a suitable filter so that such determination was effected in accordance with the indication of the meter. However, such a conventional arrangement is disadvantageous in that since the waveform of the intermediate frequency signal has a flattened top, the meter tends to provide an indication as if the tuner were in the optimum tuned state, at frequency positions of the intermediate frequency signal waveform which are deviated from the center frequency position thereof.

SUMMARY OF THE INVENTION

Accordingly, it is an object of this invention to provide an FM tuner which is so designed that determination as to whether or not the tuner is in an optimum tuned state can be effected only at the aforementioned center frequency position.

Another object of this invention is to provide a method of effecting such determination.

Other objects, features and advantages of this invention will become fully apparent from the following detailed description taken in conjunction with accompanying drawings.

DESCRIPTION OF THE PREFERRED EMBODIMENT

Figure 1:
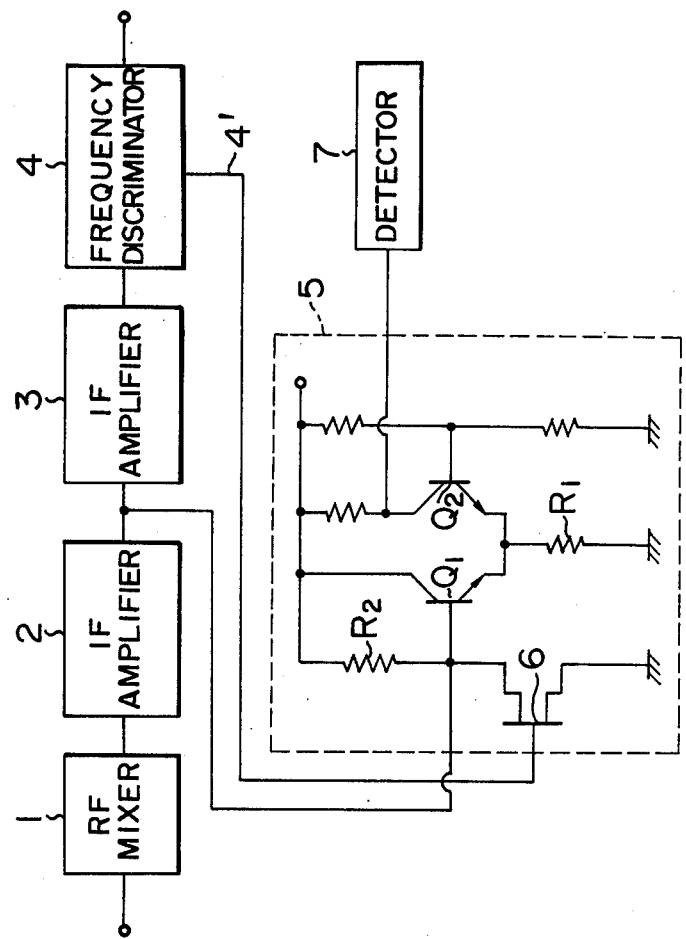
FIG. 1 is a circuit diagram showing the main portion of the FM tuner according to an embodiment of this invention.

Referring to FIG. 1, there is shown an example of the FM tuner circuit arrangement according to this invention, which includes an RF mixer 1, intermediate frequency amplifier circuits 2 and 3, and a frequency discriminator circuit 4 with so-called "S" characteristics.

According to this embodiment of the invention, a differential amplifier is provided which is shown generally at 5 in FIG. 1. The differential amplifier 5 may be constituted by using, for example, a pair of NPN transistors $Q_1$ and $Q_2$ having their emitters grounded through a resistor $R_1$, wherein an input signal is imparted to the base of the input transistor $Q_1$, and an output signal, which will be described hereinafter, is derived from the collector of the output transistor $Q_2$. Between the base of the input transistor $Q_1$ and the earth is connected an element whose internal resistance is variable depending on a voltage applied thereto. Such an element may be constituted by a field-effect transistor 6 having the drain-source thereof connected between the base of the input transistor $Q_1$ and earth. It will be appreciated that base bias resistances for the input transistor $Q_1$ are provided by the field-effect transistor 6 and a resistor $R_2$. Furthermore, the input transistor $Q_1$ has its base connected to the output of the intermediate frequency amplifier 2, and the field-effect transistor 6 has its gate connected to a direct current output terminal 4' of the frequency discriminator circuit 4. Detector means 7 may be a meter which is connected to the output of the differential amplifier 5.

Figure 2A:
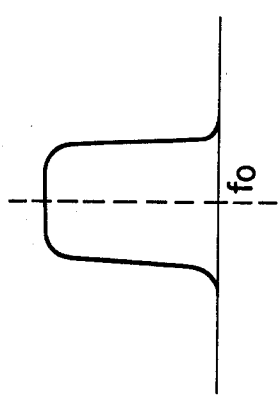
FIGS. 2(A), (B) and (C) are views useful for explaining the embodiment of this invention.
Figure 2B:
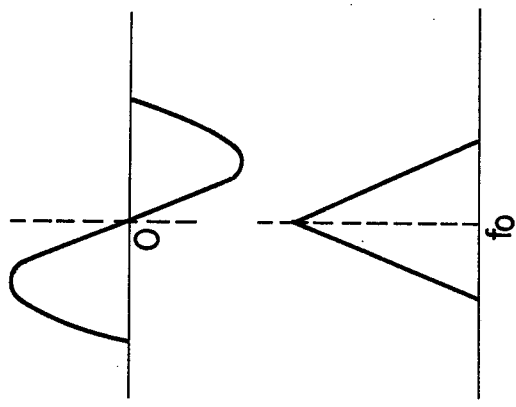

FIG. 2(A) shows a 10.7MHz intermediate frequency signal waveform which is available at the output of the intermediate frequency amplifier 2 through the RF mixer 1, wherein $f_o$ indicates the center frequency of the waveform. FIG. 2(B) illustrates the so-called "S" characteristics of the frequency discriminator 4, from which it will be appreciated that the portion intermediate between the two peaks of the characteristic curve is substantially rectilinear as is well known in the art.

DC component corresponding to the rectilinear portion of the characteristic curve shown in FIG. 2(B), which is obtained at the terminal 4', is imparted to the gate of the field-effect transistor 6 which serves as a base bias resistor for the input transistor $Q_1$, so that the internal resistance of the field-effect transistor 6 is varied depending on the d.c. component applied thereto. At the same time, the signal waveform shown in FIG. 2(A) is imparted to the base of the input transistor $Q_1$. Thus, the differential amplifier 5 produces a waveform which represents a maximum amplitude at a position corresponding to the aforementioned center frequency $f_o$ as shown in FIG. 2(C).

Figure 2C:
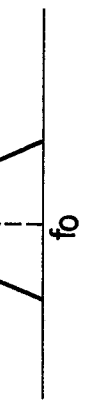

As will be appreciated from what has been described, according to this invention, it is possible to detect the optimum tuned state of the tuner only at the center frequency position of the intermediate frequency signal, by providing the waveform such as shown in FIG. 2(C) to the detector means 7. In this way, even if the intermediate frequency signal is one whose top is flattened as shown in FIG. 2(A), it is possible to prevent an erroneous indication of the tuned state of tuner from being produced at any other position than the center frequency position of such a top-flattened intermediate frequency signal waveform.

While this invention has been described with respect one specific embodiment thereof, it is to be understood that the foregoing description is only exemplary of the invention and various modifications and changes may be made therein within the spirit and scope of the invention as defined in the appended claims.

What is claimed is:

1. An FM tuner including means for producing an intermediate frequency signal; frequency discriminator means with "S" characteristics for frequency-discriminating said intermediate frequency signal; differential amplifier means responsive to a substantially rectilinear portion of said "S" characteristics to produce an output signal whose amplitude becomes maximum at a frequency position corresponding to the center frequency position of said intermediate frequency signal, said differential amplifier means comprising a first transistor and a second transistor connected to each other so as to constitute a differential amplifier, and a variable resistance element connected to said frequency discriminator means in such a manner that the internal resistance is variable depending on a d.c. component output which is provided by said frequency discriminator means, said variable resistance element being associated with said differential amplifier, wherein said intermediate frequency signal is imparted to the base of said first transistor; and detector means responsive to said output signal provided by said differential amplifier means to produce an indication as to whether said tuner is in a tuned state or not.

2. An FM tuner according to claim 1, wherein said variable resistance element is utilized as a base bias resistor for said first transistor, and said output signal is derived from the collector of said second transistor.

3. An FM tuner according to claim 2, wherein said variable resistance element comprises a field-effect transistor having the gate thereof connected to a d.c. component output terminal of said frequency discriminator means and the source-drain thereof connected between the base of said first transistor and ground.

4. An FM tuner according to claim 1, wherein said detector means comprises means responsive to said output signal to produce an indication proportional to the amplitude of said output signal.

5. An FM tuner according to claim 1, wherein said detector means comprises at least one light emission diode responsive to a predetermined level of said output signal.

* * * * *